US005543995A

United States Patent [19]
Kumagai et al.

[11] Patent Number: 5,543,995
[45] Date of Patent: Aug. 6, 1996

[54] METHOD AND APPARATUS FOR PROTECTING A POWER TRANSMISSION LINE

[75] Inventors: Kajuaki Kumagai; Hiroshi Takiguchi, both of Hitachi; Shigeru Abe, Hitachiota, all of Japan

[73] Assignee: Hitachi, Ltd., Tokyo, Japan

[21] Appl. No.: 69,574

[22] Filed: Jun. 1, 1993

[30] Foreign Application Priority Data

Jun. 1, 1992 [JP] Japan .................................. 4-140279

[51] Int. Cl.⁶ ........................................... H02H 3/00
[52] U.S. Cl. ................... 361/65; 361/80; 361/42; 324/522
[58] Field of Search .................. 361/42, 44, 47, 361/63, 64, 76, 78, 79, 80, 82, 84, 88, 90, 45, 65–68, 71, 72, 93; 340/650, 652, 661; 364/483; 324/509, 512, 520–522, 524, 539, 540, 541

[56] References Cited

U.S. PATENT DOCUMENTS 4,800,509  1/1989  Nimmersjö .......................... 361/82
5,245,498  9/1993  Uchida et al. ....................... 361/47
5,267,231  11/1993  Dzieduszko ......................... 361/64

OTHER PUBLICATIONS

"Protective Relaying System" published by Denki Shoin, Feb. 25, 1974, pp. 138–139.

Primary Examiner—Howard L. Williams
Assistant Examiner—Ronald W. Leja
Attorney, Agent, or Firm—Antonelli, Terry, Stout & Kraus

[57] ABSTRACT

Method and apparatus for preventing reclosing of circuit breakers to reconnect a transmission line when a break fault occurs in the transmission line. A voltage at a fault point is estimated from opposite ends of the transmission line, and when those voltages are not equal, the break fault of the transmission line is determined, the break fault is displayed and the reclosing by a protective relay is prevented. By specifying a fault of the transmission line as a break fault, a recovery time of the transmission time is significantly reduced and an equipment is protected because the closing of the circuit breaker is blocked during the fault.

6 Claims, 7 Drawing Sheets

: 1

METHOD AND APPARATUS FOR PROTECTING A POWER TRANSMISSION LINE

BACKGROUND OF THE INVENTION

The present invention relates to method and apparatus for protecting a power transmission line, and more particularly to a method for protecting a power transmission line and a protection apparatus using a protective relay device which can prevent reclosing at the time of breaking of the transmission line.

A prior art protective relay device for the transmission line is constructed as shown in "Protective Relaying System" published by Denki Shoin on Feb. 25, 1974, pages 138–139. In the prior art, when a fault occurs in the power transmission line, a breaker is opened and it is reclosed when a predetermined time has elapsed.

The background of adopting such reclosing operation in the prior art protective relay device for the transmission line is that many of faults which occur in the power transmission line are due to the break of insulation by thunder, and an arc at a fault point extinguished by opening the breaker and an operation may be continued by reclosing. Most of those faults are by grounding or short-circuiting, but in rare cases, the transmission line is broken by the contact of a crane car or a fallen tree.

In the prior art protective relay apparatus, the fault occurred in the power transmission line is detected as a grounding or short-circuiting fault and a predetermined protective operation is carried out depending on the type of fault, but as to the break fault, it is not determined whether the break of the line has occurred or not but it is treated as the grounding or short circuiting fault.

Accordingly, if the fault is a break of the line and it was caused by the contact by a crane car, there is a high possibility that a human is present around the site of the break of the line and there is a risk of accident if the power transmission line is recharged by the reclosing.

SUMMARY OF THE INVENTION

It is a main object of the present invention to provide a method and apparatus for protecting a power transmission line which can determine whether a fault of the transmission line is a break of the transmission line or not, and preventing the reclosing when it is the break of the transmission line.

It is another object of the present invention to significantly reduce a recovery activity time for the power transmission line by a power service company when a fault in the power transmission line is a break of the transmission line.

It is a further object of the present invention to protect an equipment by preventing the closing of a breaker during the fault.

In accordance with the present invention, a voltage at a fault point is estimated from the respective ends of the transmission line, and if the voltages are different, it is determined that a break of the transmission line has occurred and the reclosing by a protective relay device is prevented. If the fault in the transmission line is due to the grounding or short-circuiting, the voltages at the fault point estimated from the respective ends of the transmission line are equal, but in case of the break of the transmission line, the voltages are different. Accordingly, the break of the transmission line may be detected by estimating the voltages at the fault point from the respective ends of the transmission line and detecting a difference therebetween.

BRIEF DESCRIPTION OF THE DRAWINGS

Preferred embodiments of the present invention will now be described in conjunction with the accompanying drawings, in which.

DESCRIPTION OF THE PREFERRED EMBODIMENTS

Figure 1:
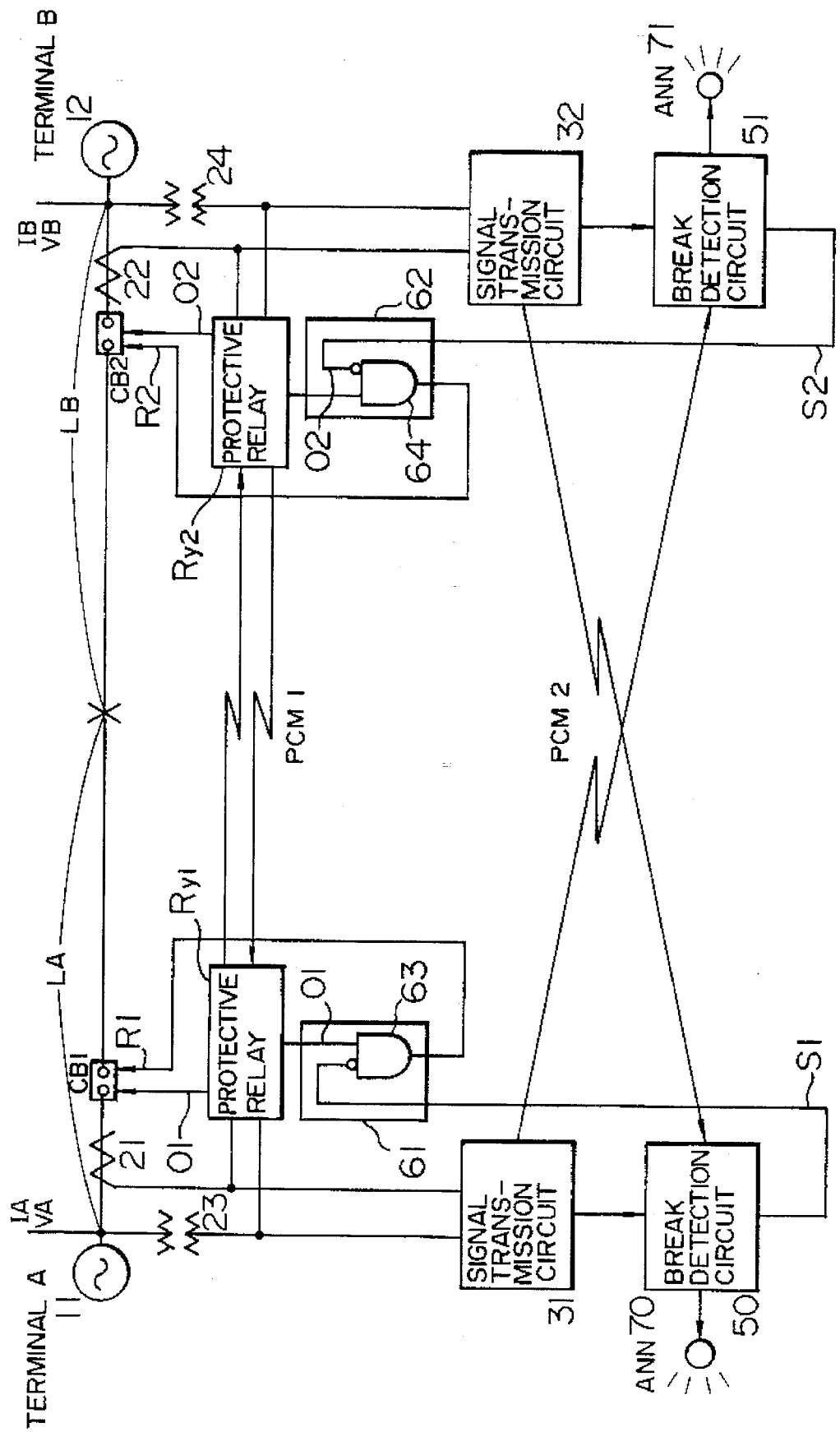
FIG. 1 shows an electric circuit diagram of one embodiment of a protective relay device used in a protection apparatus of the present invention.

FIG. 1 shows a basic configuration of a protective relay device used in a power transmission line protection apparatus of the present invention. In FIG. 1, numerals 11 and 12 denote power supplies which are interconnected by a power transmission line L through two circuit breakers CB1 and CB2. A current i and a voltage v of the transmission line L are detected by current transformers 21 and 22, and voltage transformers 23 and 24, respectively, and two protective relays Ry1 and Ry2 detect a fault based on those inputs and the two circuit breakers CB1 and CB2 are opened based on the outputs from protective relays Ry1 and Ry2. In the embodiment of FIG. 1, the protective relays Ry1 and Ry2 are provided at the opposite ends A and B of the transmission line L, respectively, and the currents and the voltages detected by the protective relays Ry1 and Ry2 are transmitted to each other through a communication line PCM1 so that a fault is detected based on the Kirchhoff's first law relating to a principle of difference. The voltage inputs are used as fault detection elements and they may also be used to specify a cause of the fault such as estimating the cause by a degree of voltage drop when a fault occurs in the transmission line. The protective relays Ry1 and Ry2 may be of known construction which can detect the fault in the transmission line and detailed description thereof is omitted. The respective outputs O1 and O2 of the protective relays Ry1 and Ry2 are applied to the circuit breakers CB1 and CB2 at the corresponding terminals A and B to open them to eliminate the fault of the transmission line.

The respective outputs O1 and O2 of the protective relays Ry1 and Ry2 are also applied to reclosing devices 61 and 62, respectively, which issue reclosing command signals R1 and R2, respectively, to the circuit breakers CB1 and CB2 at the corresponding terminals when conditions of NAND circuits 63 and 64 are met, that is when a so-called reclosing condition is met, to open the circuit breakers CB1 and CB2 at the corresponding terminals A and B. In many cases, the fault in the transmission line is eliminated by the above process and an operation may be continued. The reclosing condition includes the elapse of a predetermined zero-voltage time of the transmission line, and the coupling of at least two phases in the two channels of power transmission line. The zero-voltage time means a time in which the circuit breakers CB1 and CB2 are opened and a fault current is removed. Normally, the power transmission line is operated in 2 channels×3 phases.

The construction of the prior art protective relay device of the power transmission line protection apparatus has been described above. In the present invention, a power transmission line break detection device is further provided. The break detection device comprises signal transmission circuits 31 and 32 for transmitting currents and voltages detected at the terminals A and B to the other terminals through a communication line PCM2 and break detection circuits 50 and 51 for estimating voltages at the fault point based on the voltages at the terminals A and B and determine a break fault when the voltages at the fault points estimated from the terminals A and B are different. Outputs S1 and S2 of the break detection circuits 50 and 51 are applied to NAND circuits 63 and 64 in the reclosing devices 61 and 62, respectively, to stop the proceeding of the reclosing by the reclosing devices 61 and 62 and prevent the reclosing of the circuit breakers CB1 and CB2. Namely, when the circuit breakers CB1 and CB2 are open, power is not transmitted. As a result, power for all houses is interrupted or stopped.

In this manner, an accident with respect to a human body by recharging of the power transmission line in case of the break fault is prevented.

When the break detection circuits 50 and 51 detect the break fault, it is displayed on power transmission line annunciators ANN 70 an 71. In many cases, those break detection devices 50 and 51 are installed in a substation where an operator is present, and in case of a permanent fault (fault to the reclosing or break fault), the operator is urgently dispatched to the site for recovery. If it is previously known that the fault is the break fault, a safety measure to prevent electric shock accident may be taken so that the display output of the break fault by power transmission line annunciators ANN 70 and 71 is effective as a premeasure for the recovery.

Figure 2:
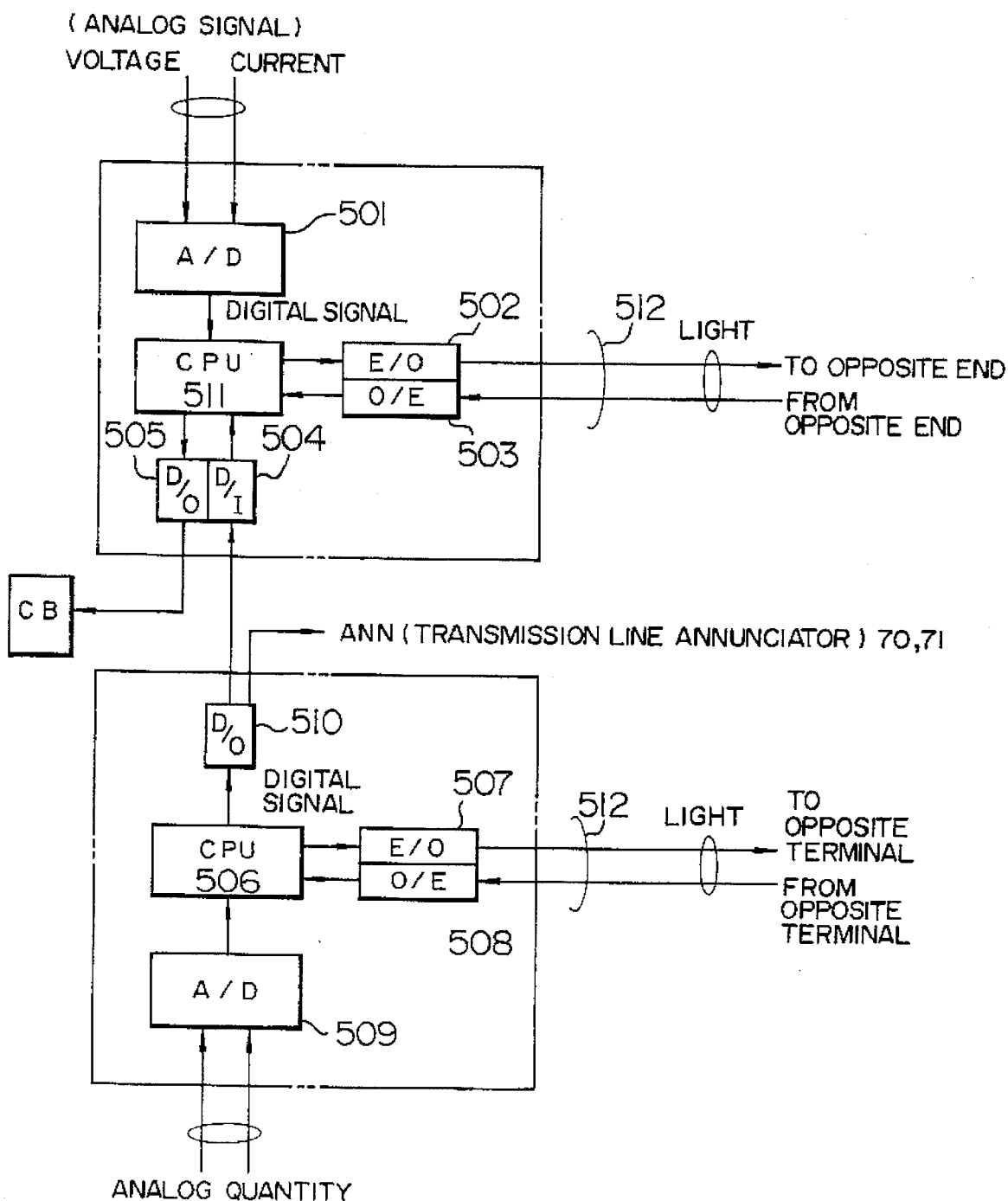
FIG. 2 shows a circuit configuration for implementing a power transmission line break detection device by a digital device in the protective relay device shown in FIG. 1.

FIG. 2 shows a configuration of a digital device 500 of the break detection circuits 50 and 51 shown in FIG. 1.

In the digital device of FIG. 2, numerals 501 and 509 denote analog-digital converters, numerals 502 and 507 denote electric-photo converters, numerals 503 and 508 denote photo-electrical converters, numeral 504 denotes a data input unit, numerals 505 and 510 denote data output units, numeral 506 denotes a break detection computer, and numeral 511 denotes a grounding/short-circuiting detection computer with a reclosing detection function.

An operation of the digital device 500 is explained below. Analog quantities of input voltage and input current are converted to digital quantities by the analog-digital (A/D) converters 501 and 509. The digital data are then converted to light quantities by the electrical-photo converters 502 and 507 by the operation of the grounding/short-circuiting detection computer 511 and the break detection computer 506 which comprise CPU's, and they are sent to the opposite ends through an optical fiber 512.

The grounding/short-circuiting detection computer 511 detects the grounding/short-circuiting fault and trips the circuit breakers CB1 and CB2 based on the detection information. The break detection computer 506 determines if there is a break in the line and sends a signal from the output circuit 510 to a protective relay (not shown), which determines whether to reclose (closing of CB1 and CB2) or not based on the signal sent from the data input unit 504.

Figure 3:
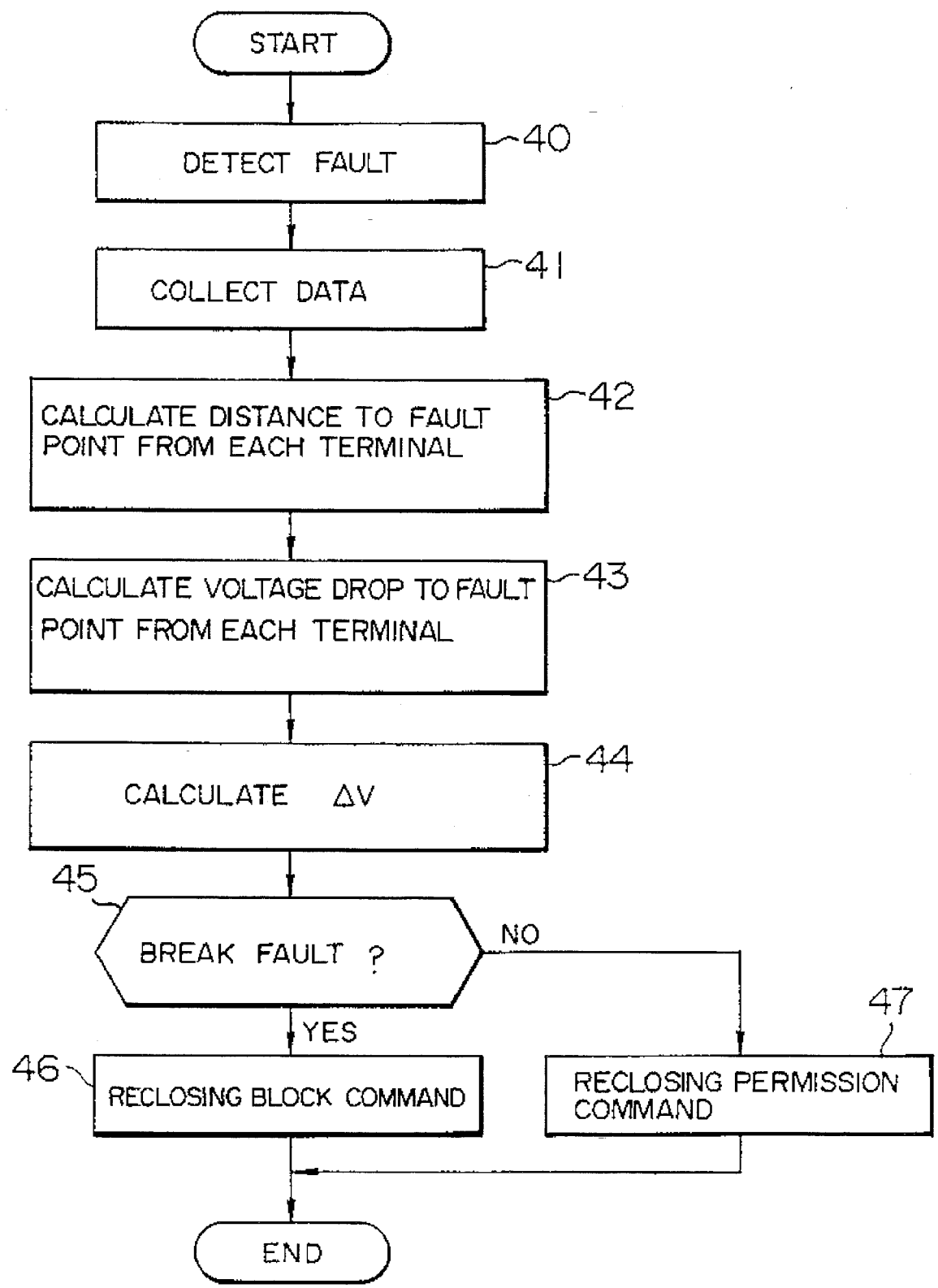
FIG. 3 shows a processing program for implementing the power transmission break detection device by the digital device in the protective relay device shown in FIG. 1.

A processing program when the transmission line break detection device of the protective relay device of FIG. 1 is shown in FIG. 3. In a block 40, a fault in the transmission line is detected, and in a block 41, data of currents and voltages at the terminals of the transmission line after the occurrence of the fault is collected.

In a block 42, the following operation is executed to estimate distances $L_A$ and $L_B$ to the fault point F from the terminals A and B.

$$L_A = V_A / (I_A \cdot Z) \cdot \sin\theta_A \qquad (1)$$

$$L_B = V_B / (I_B \cdot Z) \cdot \sin\theta_B \qquad (2)$$

In the formula (1), $L_A$ represents a distance from the terminal A to the fault point F, $V_A$ represents a voltage detected at the terminal A, $I_A$ represents a current detected at the terminal A, Z represents an impedance per unit distance of the transmission line to be protected, and $\theta_A$ represents a phase difference between the voltage $V_A$ at the terminal A and the current $I_A$ at the terminal A. Similarly, in the formula (2), $L_B$ represents a distance from the terminal B to the fault point F, $V_B$ represents a voltage detected at the terminal B, $I_B$ represents a current detected at the terminal B, and $\theta_B$ represents a phase difference between the voltage $V_B$ detected at the terminal B and the current $I_B$ at the terminal B.

In a block 43, the following operation is executed to estimate voltages $V_a$ and $V_b$ at the fault point F from the terminals A and B.

$$V_a = V_A - L_a \cdot Z \cdot I_A \qquad (3)$$

$$V_b = V_B - L_B \cdot Z \cdot I_B \qquad (4)$$

In the formulas (3) and (4), the terms $L_A \cdot Z \cdot I_A$ and $L_B \cdot Z \cdot I_B$ represent voltage drops from the respective terminals to the fault point F, and $V_a$ and $V_b$ represent a fault point voltage estimated from the terminal A and a fault point voltage estimated from the terminal B, respectively. When the fault in the transmission line is a grounding or a short-circuiting situation, the fault point voltages, $V_a$ and $V_b$ are the same whether they are determined from one terminal or the other terminal, but in case of the break, two different values appear in most cases because the transmission line is broken.

Therefore, in a block 44, the following operation is executed to calculate a differential voltage $\Delta V = V_a - V_B$.

$$\Delta V = V_a - V_b \qquad (5)$$

In the block 44, if $\Delta V$ is larger than a predetermined value k (which is determined by length, thickness and material of the system), it is determined that a break fault has occurred. On the other hand, if $\Delta V$ is smaller than the predetermined value k, a reclosing command is issued.

In case of the break fault, reclosing block command S1 and S2 are issued in a block 46 to stop the reclosing. If it is not the break fault, a reclosing permission command is issued (the reclosing block commands S1 and S2 are not issued) in a block 47, and as soon as the reclosing condition is met, the reclosing is conduct.

Figures 4, 5:
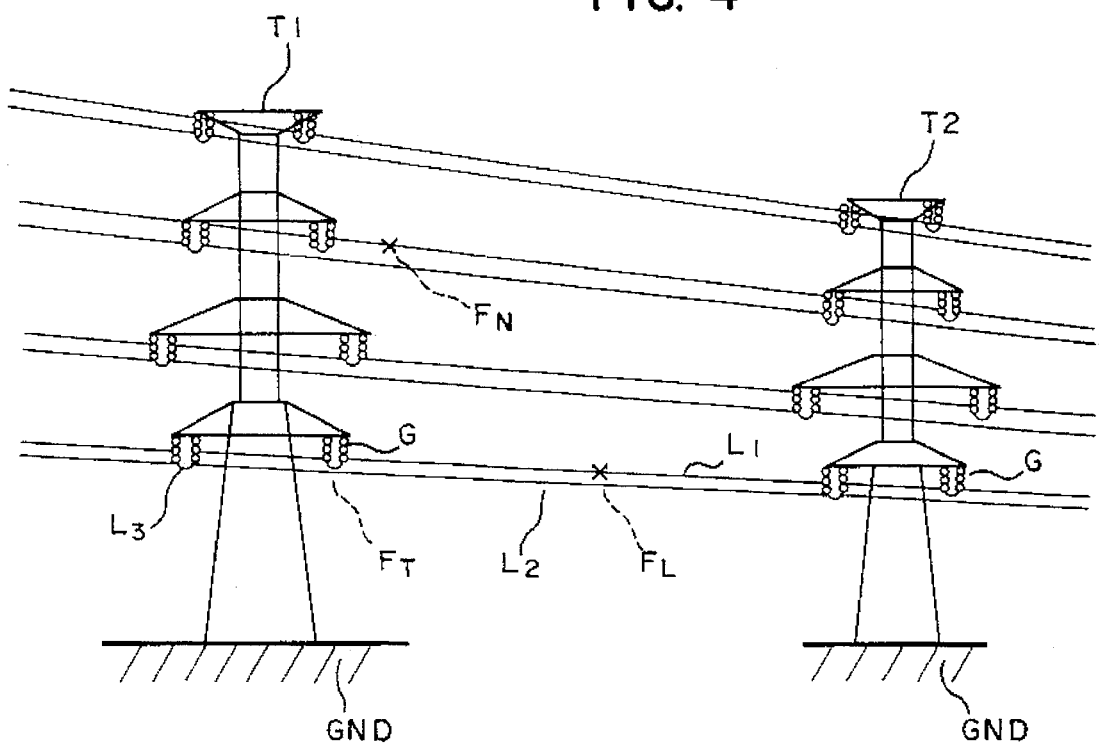
FIG. 4 shows connection of the power transmission line to be protected by the present invention.
FIG. 5 illustrates a one-line break fault in a 3-phase power transmission line in the present invention.

An effective operation of the present invention is now explained in conjunction with a specific fault case. FIG. 4 shows the connection of the power transmission line to be protected by the present invention. The transmission line L is supported by two sets of insulators G suspending from towers T1 and T2, respectively. A transmission line connecting the two sets of one tower is called a jumper line L3. In the embodiment of FIG. 4, one channel of transmission lines L1 and L2, that is, three phases of lines are shown. In such transmission lines, the fault points are primarily classified into a portion FT of the jumper line L3, a portion FN of the nearby transmission line to the jumper line 13, and a center portion FL of the transmission line.

FIG. 5 shows a one-line break fault as an example of the fault in the 3-phase transmission line. In case a, the break occurs at the portion FT of the jumper line FT of FIG. 4. Because the jumper line is sufficiently short, the broken ends are not grounded. In case b, the break occurs at the portion FN of the transmission line near the jumper line L3. Only the longer transmission line is grounded. In case c, the break occurs at the center portion FL of the transmission line. One of the line is grounded but the other line twisted around the line of other phase. In case d, the break occurs at the center portion FL of the transmission line and both lines are grounded. The function of the present invention is explained for each case. It is assumed that the protective relay Ry of FIG. 1 has a main protective relay of a differential principle, so that it issues a break-off command to the circuit breaker. The main protective relay of the differential principle includes not only one which uses the current differential principle of the Kirchhoff's first law but also a phase comparison method in which current phase at the opposite ends are sent to each other to utilize a change of the phase angle between the fault case and the non-fault case.

Case a: In this fault, a pass current of the fault phase is zero but the main protective relay of the differential principle is not activated because of no differential input and the break-off command for the relay is not issued. Even if the break detection circuits 50 and 51 attempt to estimate the fault point voltages from the terminals, the voltages at the respective terminals A and B are determined because the currents are zero, and the detection is not successful because the difference k in the formula (5) does not substantially occurs. A maintenance operator in the substation, however, can assume that the case a is the break fault from a comprehensive judgement such as the facts that other break fault is detectable and displayable, and the transmitted power is zero in spite of the closure of the circuit breaker.

Case b: In this fault, the currents detected at the opposite ends of the fault phase are different from each other so that the break-off of the circuit breaker is conducted. The fault point voltage estimated by the break detection circuit 51 is essential equal to the voltage at the terminal B while the voltage estimated from the terminal A drops. The differential voltage ΔV is sufficiently larger than the reference voltage k and the reclosing is positively prevented.

Case c: In this fault, the currents detected at the opposite ends of the fault phase are different from each other and the break-off of the circuit breaker is conducted. The fault point voltage estimated by the break detection circuit 50 is essentially equal to the voltage at the terminal A while the voltage estimated from the terminal B drops. The differential voltage ΔV is sufficiently larger than the reference voltage k and the reclosing is positively prevented.

Case d: In this fault, the currents detected at the opposite ends of the fault phase are different from each other and the break-off of the circuit breaker is conducted. If the fault point voltages estimated by the break detection circuits 50 and 51 at the respective terminals are different depending on the arc status at the grounding point, the reclosing may be prevented. However, there is a possibility that the broken lines are grounded with the substantially same condition and the detection may not be attained. This may happen when the broken lines drop in the same pond. However, since such a fault is very rare and the effect of the present invention is great when considering that the break fault could not be detected in the prior art.

Figure 6:
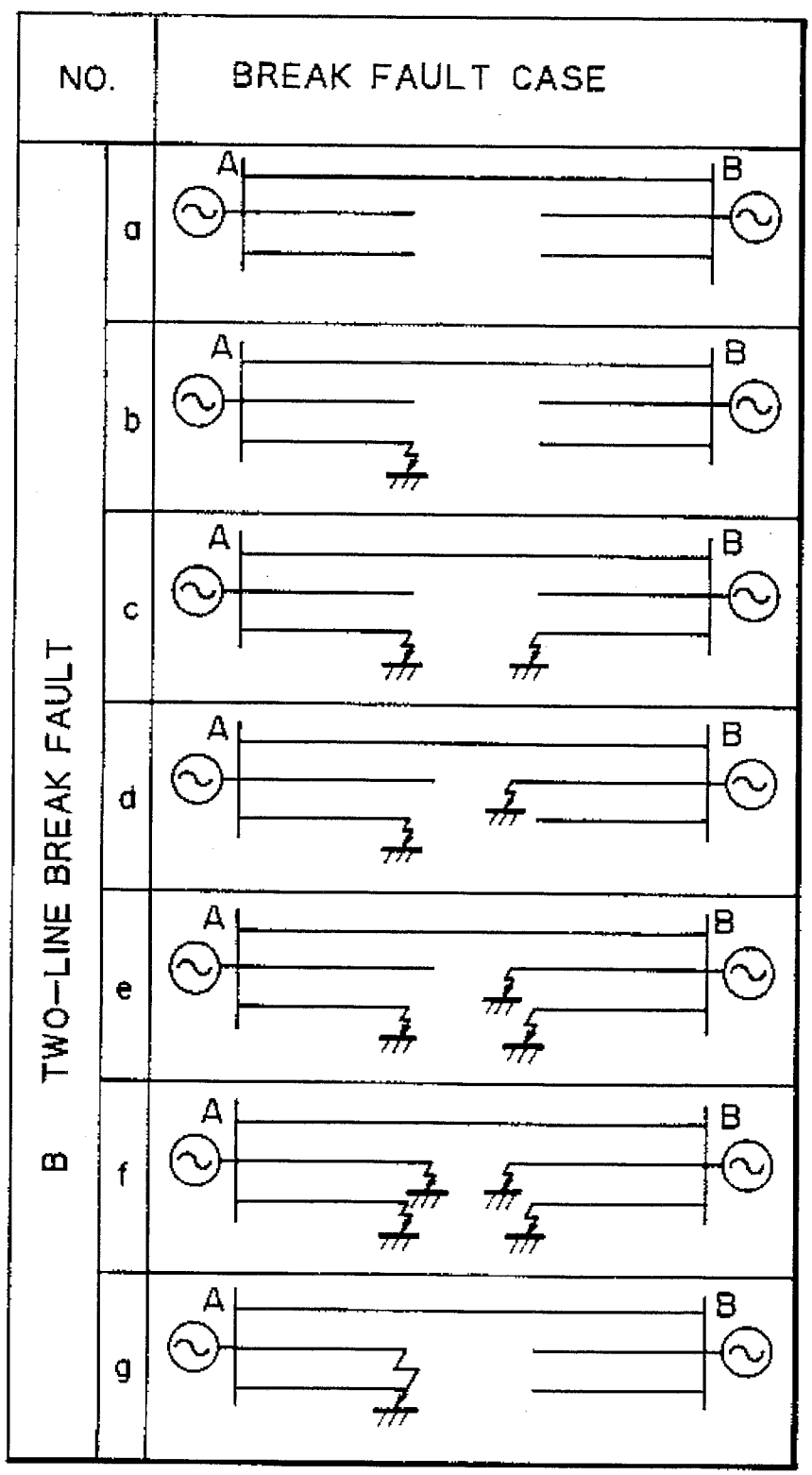
FIG. 6 illustrates a 2-line break fault in the 3-phase power transmission line in the present invention.
Figure 7:
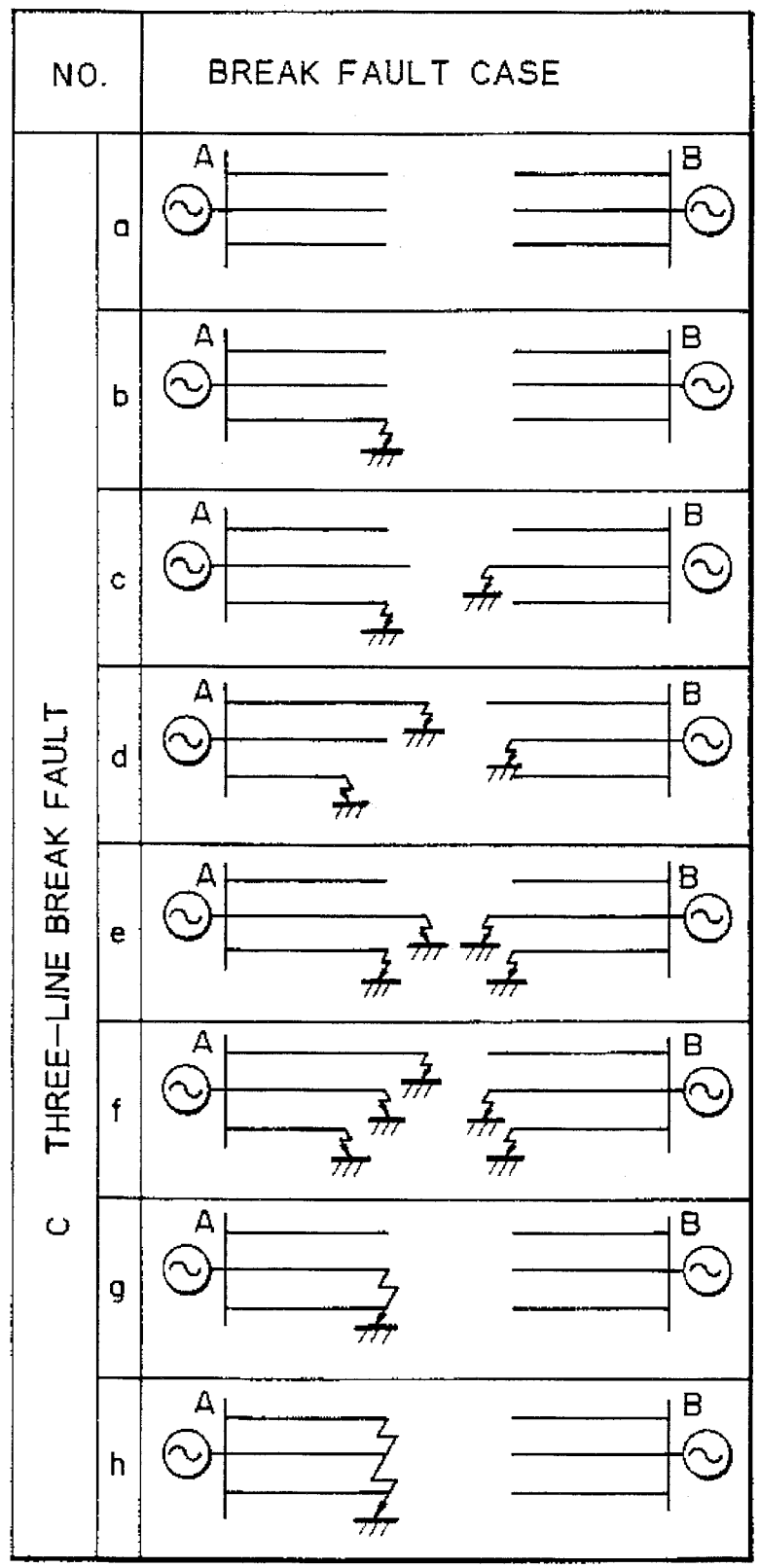
FIG. 7 shows a 3-line break fault in the 3-phase power transmission line in the present invention.

FIGS. 6 and 7 show case of 2-line break and 3-line break, respectively. It will be apparent from the explanation of FIG. 5 at what point of the transmission line those cases occur. In those cases, if it is not the fault FT occurred in the jumper line of FIG. 4, the reclosing is prevented, and if the break occurs between the upper and lower insulators of the tower T1 or T2, the reclosing cannot be locked because it is not detected as the break. Since it will be readily understood from the explanation of FIG. 5, detailed description is omitted here.

While the present invention is constructed as shown in FIGS. 1–3, various modifications may be made without changing the gist of the present invention. In one example thereof, the protective relay Ry of FIG. 1 which transmits signals through the communication line PCM 1 and detects the fault based on the current differential principle may be substituted by one such as of distance relay system which determines the fault based only on the current and the voltage of its own end, that is, the grounding and short-circuiting fault is detected by the voltage equation based only on the one-side line information, or the fault may be detected based on the detection principle that a large current abruptly flows out.

In the distance rely system, the protective relays at the opposite terminals A and B may not make the same fault determination. For example, in the case b of FIG. 5, the internal fault is determined at the terminal A but the internal fault may not be determined or no determination may be made at the terminal B. In such a case, one of the circuit breakers may be opened but the other is closed. As a result, one break detection circuit 50 functions to prevent the reclosing but the other does nothing. In order to solve such a problem, in the apparatus of FIG. 1, it is effective to take measure that the operation status of the distance relay system protective relay is informed to the other terminal through the signal transmission line of the break detection circuit to forcibly open the circuit breaker and prevent the subsequent reclosing.

In other modification, the two sets of communication line PCM 1 and PCM 2 for the protective relay and the break detection circuit shown in FIG. 1 may be shared one.

Figure 8:
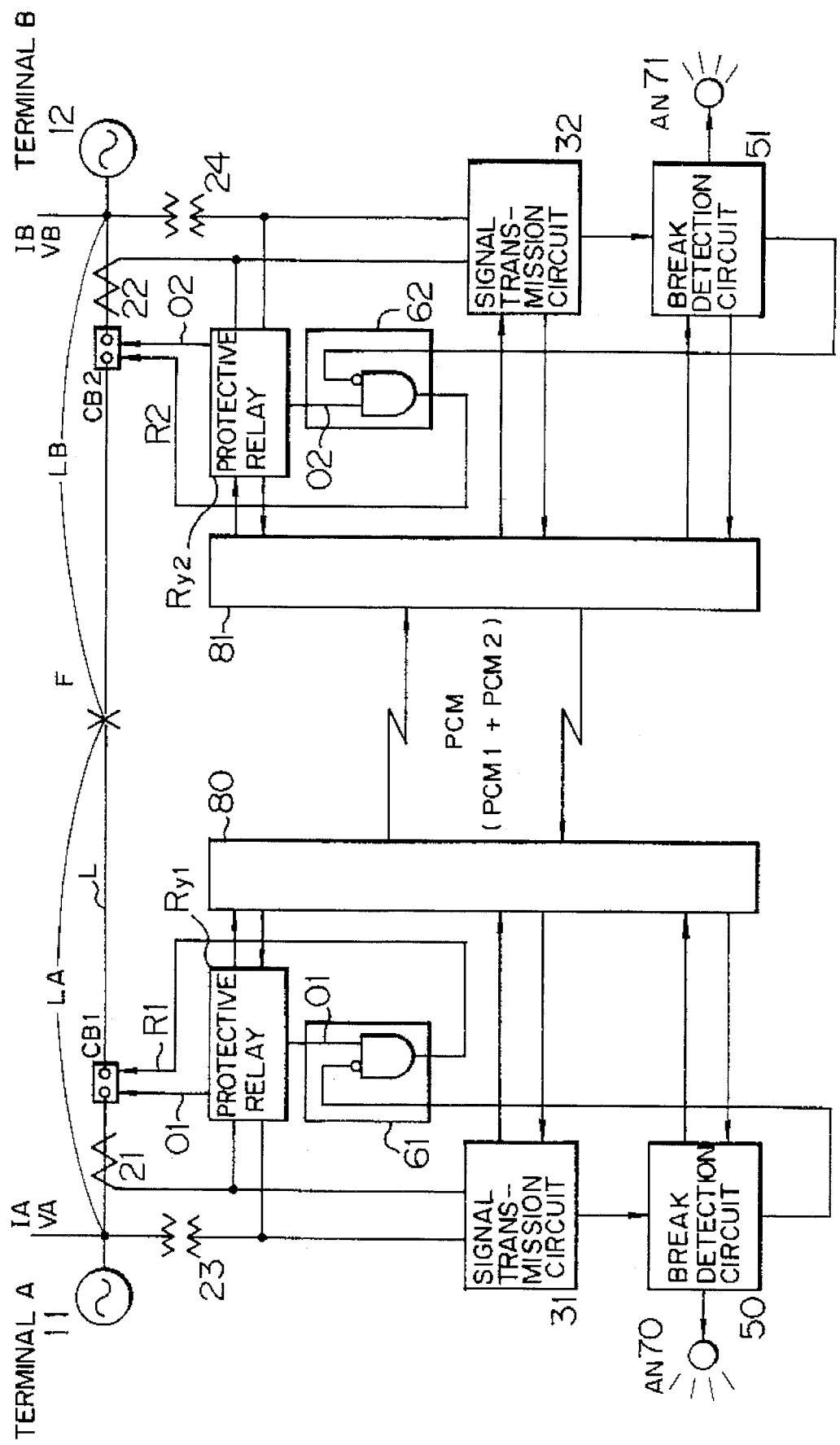
FIG. 8 shows an electrical circuit diagram of another embodiment of the protective relay device used in the protection apparatus of the present invention.

FIG. 8 shows an electrical diagram of another embodiment of the protective relay device used in the protection apparatus of the present invention. Instead of the two sets of communication lines PCM 1 and PCM 2, a shared PCM is used.

In FIG. 8, information of the protective relay and information of the break detection signal transmission circuit may be transmitted without problem through a common optical fiber by light multiplexers 80 and 81, and the transmission is made between the terminal A and the terminal B bilaterally.

While the break detection circuits 51 and 52 are provided at the respective terminals A and B, it may be provided at only one of the terminals and the result may be transmitted to the other terminal to prevent the reclosing. The break detection circuit 51 and 52 may directly transmit the detected voltages and currents or transmit only the fault point estimated voltage $|\Delta V|$ resulting from the determination.

In the embodiments of the present invention, the formulas (1) to (5) are used as particular means to estimate the fault point voltage although other method which can attain a higher detection accuracy may be used.

In the embodiment of FIG. 1, the break detection circuits 51 and 52 are provided to prevent the reclosing. They may be used in the same manner as the protective relay Ry to break off the circuit breaker. Namely, if the protective relay Ry detects the grounding or short-circuiting fault at the break fault of the transmission line, the break-off command for the circuit breakers CB1 and CB2, that is, (1) a command from the protective relay (the grounding fault) and (2) a command from the break detection circuit (the break detection) are issued and the circuit breaker break-off command is issued by using the outputs of the break detection circuits 51 and 52 to control the opening of the circuit breaker by one of the outputs. In this case, the reclosing is prevented by the outputs of the break detection circuits 51 and 52 as it is in FIG. 1.

In the embodiment of FIG. 8, the invention is applied to the transmission line although it is equally applicable to a distribution line.

In accordance with the present invention, the following advantages are attained;

(1) whether the fault in the transmission line is the break fault or not is determined, and if it is, the reclosing is prevented.

(2) by knowing that the fault in the transmission line is the break fault, the recovery time of the transmission line by a power service company is significantly reduced.

(3) the equipment is protected because the closure of the circuit breaker CB is blocked during the fault.

What is claimed is:

1. A protective relay device comprising:

a first circuit breaker;

a second circuit breaker;

a power line normally connected at first and second ends A and B thereof to said first and second circuit breakers, respectively;

a protective relay for detecting occurrence of a fault in said power line and issuing an opening command to said first and second circuit breakers;

a reclosing device for automatically reclosing said first and second circuit breakers at the occurrence of a predetermined condition after issuance of said opening command;

a first and second voltage state detecting means for respectively detecting voltage states $A_V$ and $B_V$ at said first and second ends A and B of said power line, first and second current state detecting means for respectively detecting current states $A_I$ and $B_I$ at said first and second ends A and B of said power line, and first and second phase detection means for respectively detecting a phase difference $\theta_A$ between said voltage state $A_V$ and said current state $A_I$ at said end A and a phase difference $\theta_B$ between said voltage state $B_V$ and said current state $B_I$ at said end B;

a break detecting means which inputs voltage states $A_V$ and $B_V$ from said first and second voltage state detecting means, said current states $A_I$ and $B_I$ from said first and second current state detecting means, and said phase differences $\theta_A$ and $\theta_B$ from said first and second phase detecting means, utilizes said voltage state $A_V$, said current state $A_I$ and said phase difference $\theta_A$ to calculate a fault point voltage $V_A$ at a fault point a, utilizes said voltage state $B_V$, said current state $B_I$ and said phase difference $\theta_B$ to calculate a fault point voltage $V_B$ at a fault point b, calculates a differential voltage $\Delta_V$ using a formula $\Delta_V = (V_A - V_B)$, and determines that a break fault has occurred if said differential voltage $\Delta_V$ is larger than a predetermined value K, wherein said break fault in said power line is detected based on an inequality of said fault point voltages; and a reclosing prevention means receiving an output of said break detecting means, for preventing an automatic reclosing of said first and second circuit breakers by said reclosing device after detection of a break fault by said break detecting means.

2. A protective relay device as claimed in claim 1, wherein said power line comprises a power transmission line.

3. A protective relay device as claimed in claim 1, wherein said power line comprises a distribution line.

4. A method of providing non-reconnecting protection during a break fault in a power line, said method comprising:

providing a first circuit breaker;

providing a second circuit breaker;

providing a power line normally connected at first and second ends A and B thereof to said first and second circuit breakers, respectively;

detecting occurrence of a fault in said power line and issuing an opening command to said first and second circuit breakers;

normally automatically reclosing said first and second circuit breakers at the occurrence of a predetermined condition after issuance of said opening command;

detecting voltage states $A_V$ and $B_V$ at said first and second ends A and B of said power line, detecting current states $A_I$ and $B_I$ at said first and second ends A and B of said power line, and detecting a phase difference $\theta_A$ between said voltage state $A_V$ and said current state $A_I$ at said end A and a phase difference $\theta_B$ between said voltage state $B_V$ and said current state $B_I$ at said end B;

utilizing said voltage state $A_V$, said current state $A_I$ and said phase difference $\theta_A$ to calculate a fault point voltage $V_A$ at a fault point a, utilizing said voltage state $B_V$, said current state $B_I$ and said phase difference $\theta_B$ to calculate a fault point voltage $V_B$ at a fault point b, calculating a differential voltage $\Delta_V$ using a formula $\Delta_V = (V_A - V_B)$, determining that a break fault has occurred if said differential voltage $\Delta_V$ is larger than a predetermined value K, wherein a detecting of said break fault in said power line is based on an inequality of said fault point voltages; and preventing an automatic reclosing of said first and second circuit breakers after detection of a break fault.

5. A method as claimed in claim 4, wherein said power line is a power transmission line.

6. A method as claimed in claim 4, wherein said power line is a distribution line.

* * * * *